(12) United States Patent
Mukasa et al.

(10) Patent No.: US 7,793,709 B2
(45) Date of Patent: Sep. 14, 2010

(54) JET GENERATING DEVICE AND ELECTRONIC APPARATUS

(75) Inventors: Tomoharu Mukasa, Saitama (JP);
Kazuhito Hori, Kanagawa (JP);
Hiroichi Ishikawa, Kanagawa (JP);
Kanji Yokomizo, Kanagawa (JP);
Takuya Makino, Kanagawa (JP);
Norikazu Nakayama, Saitama (JP)

(73) Assignee: Sony Corporation, Tokyo (JP)

( * ) Notice: Subject to any disclaimer, the term of this patent is extended or adjusted under 35 U.S.C. 154(b) by 189 days.

(21) Appl. No.: 11/379,508

(22) Filed: Apr. 20, 2006

(65) Prior Publication Data

US 2006/0237171 A1 Oct. 26, 2006

(30) Foreign Application Priority Data

Apr. 21, 2005 (JP) ............................ P2005-123432

(51) Int. Cl.
*F24H 3/06* (2006.01)
(52) U.S. Cl. ..................... 165/121; 165/80.3; 361/694
(58) Field of Classification Search ................ 165/80.3, 165/121, 908, DIG. 224; 361/692, 694, 697, 361/701; 417/413.2, 322; 92/96, 163; 310/328, 310/330
See application file for complete search history.

(56) References Cited

U.S. PATENT DOCUMENTS 5,758,823 A * 6/1998 Glezer et al. .................. 239/4

| | | | |
|---|---|---|---|
| 5,798,465 A * | 8/1998 | Ziada et al. | 73/861.21 |
| 6,123,145 A | 9/2000 | Glezer et al. | |
| 6,353,295 B1 * | 3/2002 | Sridhar et al. | 315/248 |
| 6,588,497 B1 | 7/2003 | Glezer et al. | |
| 2004/0223302 A1 * | 11/2004 | Pokharna | 361/700 |

FOREIGN PATENT DOCUMENTS

| | | | | |
|---|---|---|---|---|
| EP | 1020911 | * | 7/2000 | |
| JP | 02-213200 | | 8/1990 | |
| JP | 03-116961 | | 5/1991 | |
| JP | 3-168373 | * | 7/1991 | 417/322 |
| JP | 3-222878 | * | 10/1991 | 417/322 |
| WO | WO 2005/008348 | | 1/2005 | |

* cited by examiner

*Primary Examiner*—Teresa J Walberg
(74) *Attorney, Agent, or Firm*—Sonnenschein Nath & Rosenthal LLP

(57) ABSTRACT

A jet generating device includes a vibrating member which vibrates gas, a driving unit which drives the vibrating member, and a housing which has a first opening and a first chamber connected to the first opening and containing the gas. The housing supports the vibrating member, and is such that, of sounds generated as a result of vibrating the vibrating member, the sound having a maximum noise level has a predetermined frequency. In addition, the housing discharges the gas as pulsating gas through the first opening as a result of driving the vibrating member.

21 Claims, 7 Drawing Sheets

JET GENERATING DEVICE AND ELECTRONIC APPARATUS

CROSS REFERENCES TO RELATED APPLICATIONS

The present invention contains subject matter related to Japanese Patent Application JP 2005-123432 filed in the Japanese Patent Office on Apr. 21, 2005, the entire contents of which are incorporated herein by reference.

BACKGROUND OF THE INVENTION

1. Field of the Invention

The present invention relates to a jet generating device which generates a jet of gas and an electronic apparatus including the jet generating device.

2. Description of the Related Art

Hitherto, an increase in the performance of a personal computer (PC) has caused an increase in the amount of heat generated from a heating element such as an integrated circuit (IC). Therefore, various heat-dissipation technologies or products have been proposed. Examples of heat-dissipation methods include the following. In one method, heat is dissipated by bringing a radiating fin, formed of a metal such as aluminum, into contact with an IC and conducting heat from the IC to the radiating fin. In another method, a fan is used to dissipate heat. The fan, for example, forcefully removes air warmed in a housing of a personal computer and introduces surrounding low-temperature air to the vicinity of a heating element. In still another method, a radiating fin and a fan are both used to dissipate heat. With the radiating fin increasing the area of contact between a heating element and air, the fan forcefully removes warmed air existing around the radiating fin.

However, in forceful convection of air with such a fan, a temperature boundary layer at a surface of the fin is produced at a downstream side of the fin, thereby giving rise to the problem that the heat from the radiating fin is not efficiently removed. This problem may be solved by, for example, reducing the thickness of the temperature boundary layer by increasing fan air velocity. However, increasing the rotational speed of the fan for the purpose of increasing the fan air velocity causes noise to be generated, such as noise from a fan bearing or noise of wind produced by the fan.

Methods using a vibrating plate that reciprocates periodically (refer to, for example, Japanese Unexamined Patent Application Publication Nos. 2000-223871 (FIG. 2), 2000-114760 (FIG. 1), 2-213200 (FIG. 1), and 3-116961 (FIG. 3)) are available as methods which efficiently allow heat from a radiating fin to escape to outside air by destroying the temperature boundary layer without using a fan as an air blower. Of devices in these four documents, in particular, the devices in Japanese Unexamined Patent Application Publication Nos. 2-213200 and 3-116961 include a vibrating plate which roughly divides space in a chamber in two, a resilient member disposed in the chamber and supporting the vibrating plate, and a unit which vibrates the vibrating plate. In these devices, for example, when the vibrating plate is displaced upwards, the volume of an upper space of the chamber is reduced. Therefore, the pressure in the upper space is increased. Since the upper space is connected to outside air through a suction-exhaust opening, a portion of the air in the upper space is discharged to the outside air by the pressure increase in the upper space. At this time, the volume of a lower space that is opposite to the upper space (the vibrating plate is disposed between the lower space and the upper space) is increased, causing the pressure in the lower space to decrease. Since the lower space is connected to the outside air through a suction-exhaust opening, the pressure reduction in the lower space causes a portion of the outside air existing near the suction-exhaust opening to be sucked into the lower space. In contrast, when the vibrating plate is displaced downwards, the volume of the upper space of the chamber is increased. Therefore, the pressure in the upper space is decreased. Since the upper space is connected to the outside air through the suction-exhaust opening, the pressure reduction in the upper space causes a portion of the outside air existing near the suction-exhaust opening to be sucked into the upper space. At this time, the volume of the lower space that is opposite to the upper space (the vibrating plate is disposed between the lower space and the upper space as mentioned above) is decreased, causing the pressure in the lower space to increase. The pressure increase in the lower space causes a portion of the air in the lower space to be discharged to the outside air. The vibrating plate is driven by, for example, an electromagnetic driving method. Accordingly, by reciprocating the vibrating plate, the discharging of the air in the chamber to the outside air and the sucking of the outside air into the chamber are periodically repeated. Pulsating air induced by a periodic reciprocating movement of the vibrating plate is blown against a heating element such as the radiating fin (heat sink), so that the temperature boundary layer at the surface of the radiating fin is efficiently broken, as a result of which the radiating fin is cooled with high efficiency.

SUMMARY OF THE INVENTION

In recent years, the amount of heat that is generated by increased IC clocking is increasing. Therefore, for example, in order to destroy a temperature boundary layer formed near a radiating fin due to the generation of the heat thereof, a larger amount of air is typically sent towards the IC or the radiating fin than it has been up until now. In a method for discharging air with a vibrating plate which reciprocates periodically, such as those described in the aforementioned four documents, the amount of air that is discharged can be increased by increasing the vibration amplitude of the vibrating plate. However, the larger the vibration amplitude of the vibrating plate, the larger the noise. Therefore, for practical purposes, the vibrating plate is typically operated with a small vibration amplitude at which the noise level does not bother anyone.

One cause of this noise is sound waves that are generated by a periodic variation in air pressure in a chamber caused by a reciprocating movement of a vibrating plate. The sound waves vibrate a wall surface of the chamber or propagate through the outside air via a suction-exhaust opening, as a result of which sound waves having the same frequency as the vibration frequency of the vibrating plate are discharged into the outside air. Therefore, the higher the vibration amplitude, the more serious is the problem of noise produced by these sound waves.

Another cause of the noise is airflow sound caused by a disturbance in airflow resulting from a reciprocating movement of the vibrating plate. The larger the vibration amplitude, the higher a maximum flow velocity of the air undergoing reciprocating movement. Therefore, in the chamber, a disturbance occurs in the airflow due to a structural member (such as a driving unit or the suction-exhaust opening) which inhibits the smooth flow of the air, or a disturbance occurs in the flow of air passing through the suction-exhaust opening at a high speed or in the airflow outside the suction-exhaust opening. Consequently, noise resulting from the airflow sound produced by such disturbances becomes a problem.

Although, as in, for example, Japanese Unexamined Patent Application Publication Nos. 2-213200 and 3-116961 (lower left column on page 2 in each of these documents), the noise generated by sound waves that are produced by air vibration resulting from a reciprocating movement of the vibrating plate can be reduced by moving the vibration frequency away from an audible area, the lower the frequency, the smaller an air discharge amount per unit time (the air discharge amount is proportional to the product of the vibration amplitude, effective sectional area, and the frequency of the vibrating plate). In contrast, when the vibrating plate is vibrated with a high frequency outside the audible area, the vibration amplitude of the vibrating plate is considerably reduced by amplitude-frequency characteristics of a mechanical vibrating system including a driving unit. Therefore, the air discharge amount per unit time is reduced as expected. The airflow sound generated by a disturbance in the airflow in the chamber depends upon the maximum velocity of the vibrating plate rather than the vibration frequency of the vibrating plate. Therefore, the airflow sound is not typically restricted by a method which merely moves the vibration frequency away from the audible area.

In view of the aforementioned problems, it is desirable to provide a jet generating device which can restrict generation of noise without reducing a gas discharge amount and cooling capacity, and an electronic apparatus including the jet generating device.

According to an embodiment of the present invention, there is provided a jet generating device including a vibrating member which vibrates gas, a driving unit which drives the vibrating member, and a housing which has at least one first opening and a first chamber containing the gas, supports the vibrating member, and is such that, of sounds generated as a result of vibrating the vibrating member, the sound having a maximum noise level has a predetermined frequency. The housing discharges the gas as pulsating gas through the at least one first opening as a result of driving the vibrating member. The first chamber is connected to the at least one first opening.

According to the embodiment of the present invention, the housing is formed so that a sound having a maximum noise level of the sounds generated by the vibration of the vibrating member has a predetermined frequency. Therefore, for example, if this frequency is properly set, the generation of noise can be restricted without reducing a gas discharge amount.

The noise generated by the vibration of the vibrating member refers to a sound wave generated by periodically varying the air pressure in the first chamber by a reciprocating movement of the vibrating member (hereafter referred to as "first sound") or to an airflow sound generated by a disturbance in airflow produced by a reciprocating movement of the vibrating member (hereafter referred to as "second sound").

The predetermined frequency is, for example, equal to or greater than 1 Hz and less than 1 kHz, or equal to or greater than 60 kHz and less than 40 kHz. If the predetermined frequency is less than 1 Hz, an expected lowest air discharge amount per unit time is not typically obtained. If the predetermined frequency is equal to or greater than 40 kHz, the vibration amplitude becomes too small as a practical value.

The type of gas which may be used is not only air, but also nitrogen, helium gas, argon gas, or other types of gas.

A driving method of the driving unit may make use of, for example, an electromagnetic action, a piezoelectric action, or an electrostatic action.

In one form of the present invention, in order for the sound having the maximum noise level to have the predetermined frequency, at least one of a length of the at least one first opening, an opening area of the at least one first opening, and a volume of the first chamber is set, the length being in a direction in which the gas which is vibrated as a result of driving the vibrating member is discharged from the at least one first opening. In this form of the present invention, the at least one first opening has, in the aforementioned discharge direction, a tubular form in which the area of the at least one first opening is substantially constant, that is, a tubular form having a substantially constant thickness. In another form of the present invention, when a sound velocity is C[m/s], the volume of the first chamber is V[m$^3$], an equivalent circular radius of the opening area is r[m], the number of the at least one first opening is n, and the length of the at least one first opening is L[m], it is desirable that, for example, $\{C/(2\pi)\} \cdot [\pi r^2/\{V/(1.2 r \cdot n^{1/2} + L)\}]^{1/2} < 1000$ be satisfied. In other words, the housing is formed so that a Helmholtz resonance frequency is less than a predetermined frequency of the predetermined frequencies mentioned above or equal to or greater than a predetermined frequency of the predetermined frequencies mentioned above.

If an area having an area corresponding to the opening area is circular, the equivalent circular radius refers to the radius of this circle. If this area is other than circular, such as rectangular, the equivalent circular radius refers to the radius of a circle having an area corresponding to the area of the rectangle.

In still another form, the housing further has at least one second opening and a second chamber connected to the at least one second opening, disposed opposite to the first chamber, and containing the gas, the gas being alternately discharged as the pulsating gas through the at least one first opening and the at least one second opening by driving the vibrating member. Accordingly, when the gas is alternately discharged through the at least one first and second openings, in particular, the phases of the second sound generated from the respective openings are opposite to each other, so that the sound waves weaken each other. Therefore, the noise can be further reduced.

In still another form, similarly to the above, in order for the sound having the maximum noise level to have the predetermined frequency, at least one of a length of the at least one second opening, an opening area of the at least one second opening, and a volume of the second chamber is set, the length being in a direction in which the gas which is vibrated as a result of driving the vibrating member is discharged from the at least one second opening.

In still another form, the housing further has a partition plate disposed at a surface of the housing between the at least one first opening and the at least one second opening. By this, for example, when the at least one first and second openings are too close to each other, it is possible to, for example, prevent entrance and leaving of the gas between the openings. Therefore, it is possible to, for example, prevent the reduction of an amount of gas blown against a heating element.

In still another form, when an equivalent circular radius of an opening area of the at least one first opening and an equivalent circular radius of an opening area of the at least one second opening, which are substantially the same, are r[m], a distance between the at least one first opening and the at least one second opening is d[m], and a wavelength of the sound having the maximum noise level is $\lambda$ [m], $3r \leq d < \lambda/2$ is satisfied. The distance d is a distance between substantially the centers of the openings. Therefore, when the distance from an edge defining the at least one first opening to an edge defining the at least one second opening is $d_2$, the aforementioned formula becomes $r \leq d_2 < \lambda/2$. By making $3r \leq d$, it is possible to, for example, prevent the entrance and the leaving of the gas between the openings. By making $d < \lambda/2$, for example, there is no location where substantially maximum vibration amplitudes of sound waves generated from the openings strengthen each other, so that it is possible to prevent the generation of noise.

In still another form, the at least one first opening has a first end which is disposed adjacent to the first chamber so that an opening area of the at least one first opening increases towards the first chamber. This smoothens airflow when the gas flows into and out of the at least one first opening, so that the noise level of the second sound is reduced. The same effect is achieved even if the at least one first opening has a first end which is disposed at an outer side of the housing and which is formed so that the opening area of the first opening increases towards the outer side. Alternatively, if the at least one first opening has a first end and a second end, the first end being disposed adjacent to the first chamber so that an opening area of the at least one first opening increases towards the first chamber, the second end being disposed at an outer side of the housing so that the opening area of the at least one first opening increases towards the outer side of the housing, the airflow is expected to be further smoothened. This also applies to the case in which the housing has a second chamber and at least one second opening connected to the second chamber.

In still another form, the housing further has a first nozzle for forming the at least one first opening therein, the first nozzle having a first inclined surface which is such as to reduce a width of the first nozzle towards an outer side of the housing. This makes it easier to suck in gas around the nozzle when the gas is discharged from the at least one first opening, that is, a combined jet gas amount can be increased. This also applies to the case in which the housing has a second chamber and at least one second opening connected to the second chamber.

According to another embodiment of the present invention, there is provided an electronic apparatus including a heating element, a vibrating member which vibrates gas, a driving unit which drives the vibrating member, and a housing which has at least one first opening and a first chamber containing the gas, supports the vibrating member, and is such that, of sounds generated as a result of vibrating the vibrating member, the sound having a maximum noise level has a predetermined frequency. The housing discharges the gas towards the heating element as pulsating gas through the at least one first opening as a result of driving the vibrating member. The first chamber is connected to the at least one first opening.

Examples of the electronic apparatus are a computer (which may be a laptop computer or a desktop computer when the computer is a personal computer), a Personal Digital Assistance (PDA), an electronic dictionary, a camera, a display device, an audio/visual device, a cellular phone, a game device, and other electronic products. The heating element may be an electronic part, such as an IC or a resistor, a radiating fin (heat sink), or any other element as long as it generates heat.

As mentioned above, according to the embodiments and forms of the present invention, it is possible restrict the generation of noise without reducing the gas discharge amount and cooling capacity.

DESCRIPTION OF THE PREFERRED EMBODIMENTS

Embodiments of the present invention will hereunder be described with reference to the drawings.

Figure 1:
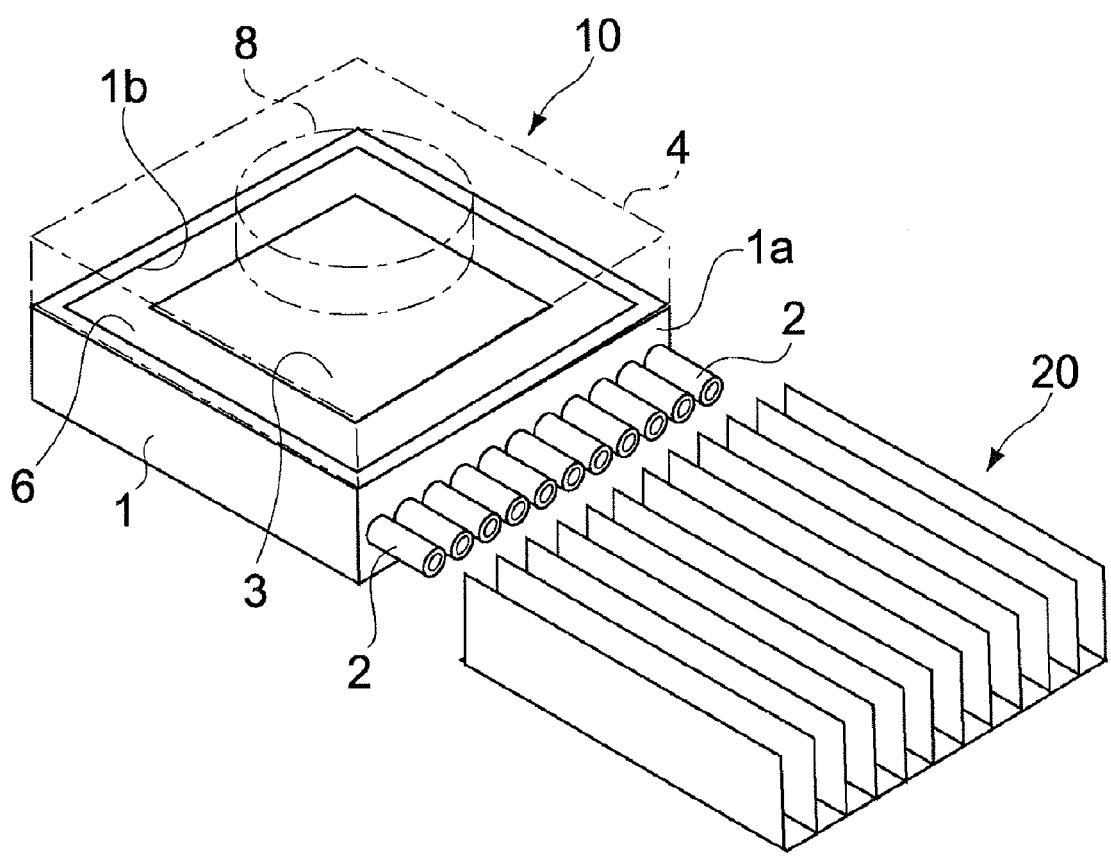
FIG. 1 is a perspective view of a jet generating device and a heat sink according to an embodiment of the present invention.
Figure 2:
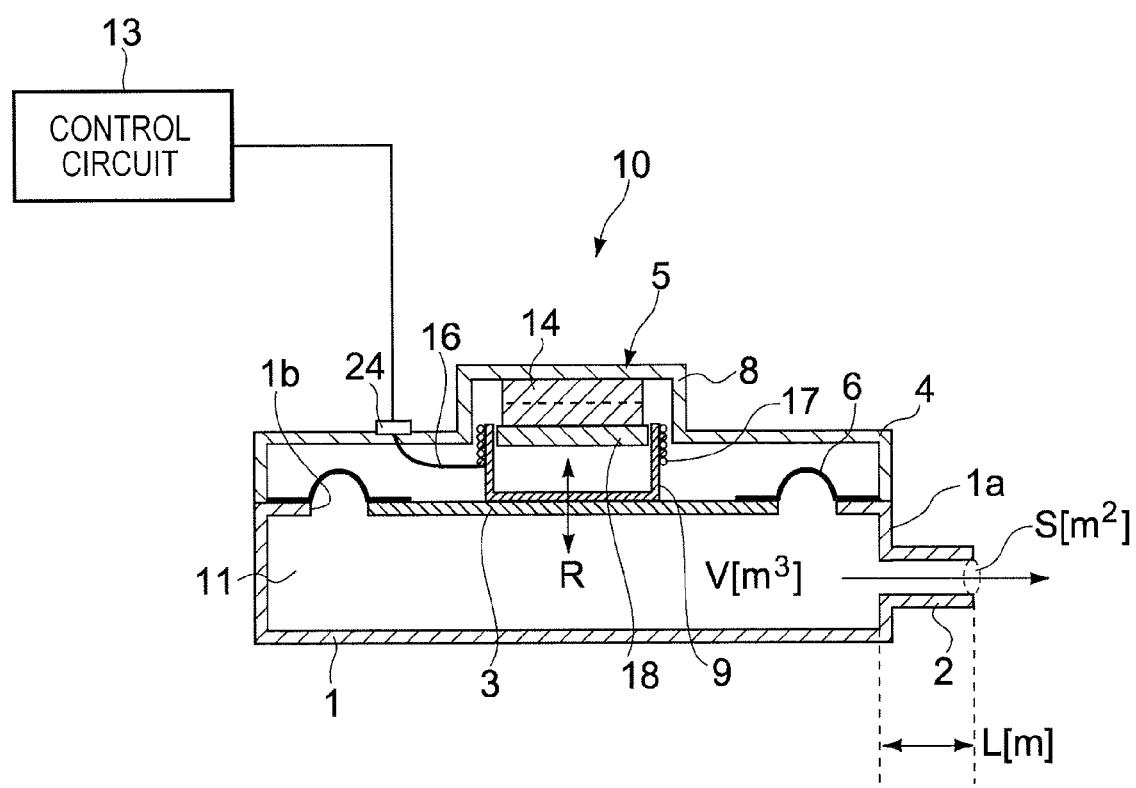
FIG. 2 is a sectional view of the jet generating device shown in FIG. 1.

FIG. 1 is a perspective view of a jet generating device and a heat sink according to an embodiment of the present invention. FIG. 2 is a sectional view of a jet generating device 10 shown in FIG. 1.

The jet generating device 10 includes a housing 1 having a rectangular hole 1b in an upper portion of the housing 1. A rectangular resilient supporting member 6 is mounted to a periphery of the hole 1b of the housing 1, and supports a vibrating plate 3 serving as a vibrating member. A chamber 11 is formed by the vibrating plate 3, the resilient supporting member 6, and the housing 1. A plurality of nozzles 2 for discharging air in the chamber 11 towards a heat sink 20 disposed outside the housing 1 are mounted to a side surface 1a of the housing 1. The nozzles 2 may be integrated to the housing 1.

An actuator 5 for driving the vibrating plate 3 is disposed at a top portion of the housing 1. For example, a magnet 14 which is magnetized in a vibration direction R of the vibrating plate 3 is disposed within a cylindrical yoke 8, and, for example, a disc-shaped yoke 18 is mounted to the magnet 14. A magnetic circuit is formed by the magnet 14 and the yokes 8 and 18. A coil bobbin 9 upon which a coil 17 is wound moves into and out of a space between the magnet 14 and the yoke 8. In other words, the actuator 5 is a voice coil motor. A power feed wire 16 is connected to the actuator 5. The power feed wire 16 is electrically connected to a control circuit 13 (such as a driving IC) through a terminal 24 mounted to a cover 4. An electrical signal is supplied to the actuator 5 from the control circuit 13.

The yoke 8 is integrally formed with the cover 4 covering the top portion of the housing 1. However, from the viewpoint of preventing spreading of magnetic flux generated by the magnet 14 from the yoke 8 to the cover 4, the yoke 8 and the cover 4 may be formed of different materials. The coil bobbin 9 is secured to a surface of the vibrating plate 3. The vibrating plate 3 can be vibrated in the directions of a double-headed arrow R by such an actuator 5.

The housing 1 is formed of, for example, resin, rubber, metal, or ceramic. Resin and rubber facilitate the formation of the housing 1 and are suited for mass-production. In addition, resin and rubber can increase a sound attenuation factor and can thus restrict noise, and can be used to reduce weight and costs. Considering heat dissipation of the housing 1, it is desirable that the metal be copper or aluminum having high thermal conductivity. The cover 4 is also formed of, for example, resin, rubber, metal, or ceramic. The housing 1 and the cover 4 may be formed of the same material or different materials. The resilient supporting member 6 is formed of, for example, resin or rubber.

The vibrating plate 3 is formed of, for example, resin, paper, rubber, or metal. Although the vibrating plate 3 is illustrated as having the shape of a flat plate, it may be cone-shaped like a vibrating plate having a speaker mounted thereto or may have a three-dimensional shape.

An operation of the jet generating device 10 having the above-described structure will be described.

When, for example, a sinusoidal alternating voltage is applied to the actuator 5, the vibrating plate 3 undergoes sinusoidal vibration, causing the volume of the chamber 11 to increase or decrease. The change in the volume of the chamber 11 changes the pressure in the chamber 11, causing airflow from the nozzles 2 to be produced as pulsating airflow. For example, when the vibrating plate 3 is displaced in the direction in which the volume of the chamber 11 is increased, the pressure in the chamber 11 is reduced. This causes air outside the housing 1 to flow into the chamber 11 through the nozzles 2. In contrast, when the vibrating plate 3 is displaced in the direction in which the volume of the chamber 11 is reduced, the pressure in the chamber 11 is increased. This causes air in the chamber 11 to be discharged outside the chamber 11 through the nozzles 2 and to be blown against the heat sink 20. A reduction in air pressure around the nozzles 2 when the air is discharged from the nozzles 2 causes the air around the nozzles 2 to be sucked into the air that is discharged from the nozzles 2. That is, jets are combined. Such combined jets make it possible to cool the heat sink 20 by blowing the combined jets against the heat sink 20.

Here, the housing 1 according to the embodiment is formed so that a sound having a maximum noise level of sounds generated by vibration of the vibrating plate 3 has a predetermined frequency. Therefore, for example, if this frequency is set to a suitable value, it is possible to restrict the generation of noise without reducing an air discharge amount.

One type of sound generated by the vibration of the vibrating plate 3 refers to a sound wave produced by periodically varying the air pressure in the chamber 11 by a reciprocating movement of the vibrating plate 3 ((hereafter referred to as "first sound"). The first sound is primarily a sound which is generated by transmitting its vibration to, for example, the housing 1 or the cover 4 as a result of, for example, periodically varying the air pressure in the chamber 11. The other type of sound generated by the vibration of the vibrating plate 3 refers to an airflow sound generated by a disturbance in airflow produced by a reciprocating movement of the vibrating member 3 (hereafter referred to as "second sound"). The second sound is primarily an airflow sound produced when air is discharged from the nozzles.

As described above, in the embodiment, the housing 1 is formed so that, of the first and second sounds, the sound having a maximum noise level has a predetermined frequency. Here, the noise level refers to a noise level that is corrected so as to match auditory sensation characteristics of human beings.

Figure 3:
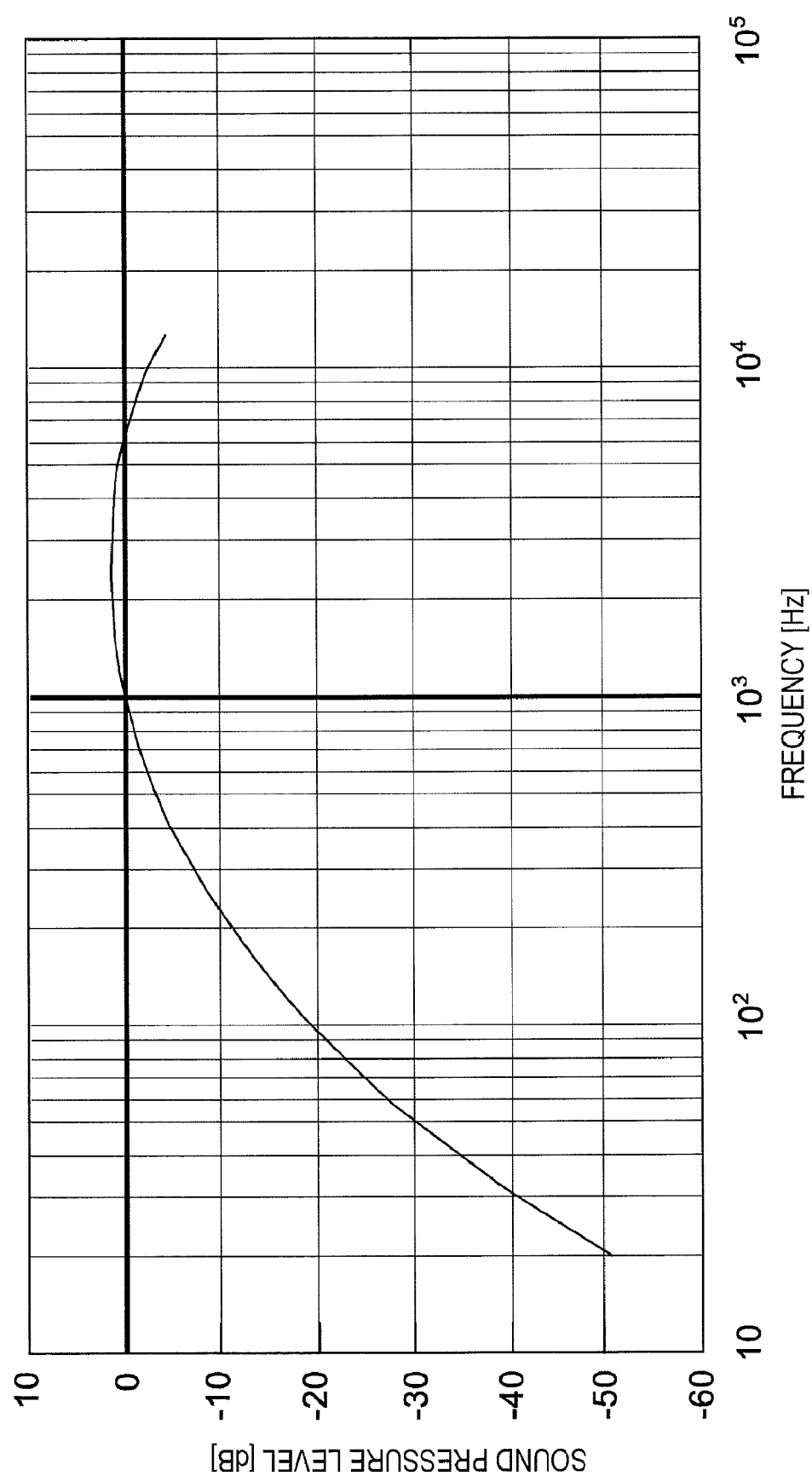
FIG. 3 is a graph of auditory sensation characteristics of human beings.

FIG. 3 is a graph of auditory sensation characteristics of human beings. This graph is an equal loudness curve (A characteristic curve) based on Japanese Industrial Standards (JIS), and shows how loud the sound in a frequency range of from 20 Hz to 20 kHz is heard when a person is exposed to a same sound pressure level. In other words, the graph shows how loud the sound at each frequency is heard with a 1-kHz sound wave being a standard. From the graph, when the sound pressure level is the same, a 50-Hz sound can be heard more softly than the 1-kHz sound by 30 dB. That is, the noise level is lower. A sound pressure level Lp[dB] is expressed by the following Formula (1):

$$Lp=20\log(p/p0) \quad (1)$$

(where p is the sound pressure [Pa], and p0 is the standard sound pressure [20 μPa])

Considering this fact, for example, the frequency of the sound having the maximum noise level is equal to or greater than 1 Hz and less than 1 [kHz]. This is because, when the frequency is in the range of from 1 [kHz] to 6 [kHz], the noise level is perceived by a human being as being relatively high. Therefore, if the frequency is less than 1 [kHz], the noise is not easily perceived, and, if the frequency is less than 1 [Hz], an expected lowest air discharge amount per unit time is not typically obtained.

The frequency may be equal to or greater than 1 [Hz] and less than 500 [Hz], or equal to or greater than 1 [Hz] and less than 20 [Hz]. This is because, if the frequency is less than 500 [Hz], from the graph shown in FIG. 3, the sound pressure level is reduced by at least 3 [dB] compared to when the frequency is 1 [kHz], so that noise is considerably reduced. The frequency is less than 20 [Hz] because this frequency falls outside an audible area of human beings.

As mentioned above, when the frequency is in the range of from 1 [kHz] to 6 [kHz], the noise level is perceived by a human being as being relatively high. Therefore, the frequency is equal to or greater than 6 [kHz] and less than 40 [kHz]. When the frequency is equal to or greater than 40 kHz, the vibration amplitude becomes too small as a practical value.

The frequency may be equal to or greater than 10 [kHz] and less than 40 [kHz], or equal to or greater than 20 [kHz] and less than 40 [kHz]. This is because, if the frequency is equal to or greater than 10 [kHz], the sound pressure level is reduced by at least 3 [dB] compared to when the frequency is 1 [kHz], so that noise is considerably reduced. The frequency is equal to or greater than 20 [kHz] because this frequency falls outside the audible area of human beings.

More specifically, in order for the sound having a maximum noise level to have a frequency equal to any of the frequencies mentioned above, as in FIG. 2, at least one of a length L[m] of the nozzles 2 (opening length), an opening area $S[m^2]$ (a flow-path sectional area of the nozzles 2 and, more specifically, an area of the nozzles 2 in a plane substantially perpendicular to the direction of the length), and a volume $V[m^3]$ of the chamber 11 is set. In this case, when the sound velocity is C[m/s], the radius of an opening plane of the openings is r[m], and the number of openings (number of nozzles 2) is n, any one of the following Formulas (2) to (7) is satisfied:

$$\{C/(2\pi)\} \cdot [\pi r^2 / \{V/(1.2 r \cdot n^{1/2} + L)\}]^{1/2} < 1000 \quad (2)$$

$$\{C/(2\pi)\} \cdot [\pi r^2 / \{V/(1.2 r \cdot n^{1/2} + L)\}]^{1/2} < 500 \quad (3)$$

$$\{C/(2\pi)\} \cdot [\pi r^2 / \{V/(1.2 r \cdot n^{1/2} + L)\}]^{1/2} < 20 \quad (4)$$

$$\{C/(2\pi)\} \cdot [\pi r^2 / \{V/(1.2 r \cdot n^{1/2} + L)\}]^{1/2} \geq 6000 \quad (5)$$

$$\{C/(2\pi)\} \cdot [\pi r^2 / \{V/(1.2 r \cdot n^{1/2} + L)\}]^{1/2} \geq 10000 \quad (6)$$

$$\{C/(2\pi)\} \cdot [\pi r^2 / \{V/(1.2 r \cdot n^{1/2} + L)\}]^{1/2} \geq 20000 \quad (7)$$

In other words, the housing is formed so that a Helmholtz resonance frequency is less than a predetermined frequency of the predetermined frequencies mentioned above or equal to or greater than a predetermined frequency of the predetermined frequencies mentioned above. The numbers on the right side in these Formulas (2) to (7) have these values due the same reasons mentioned above.

Figure 4:
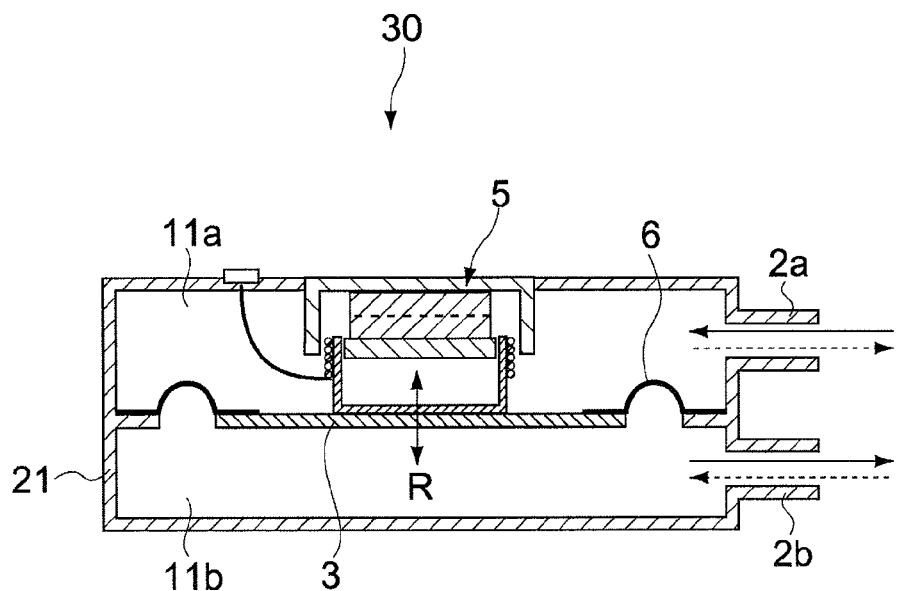
FIG. 4 is a sectional view of a jet generating device according to another embodiment of the present invention.

FIG. 4 is a sectional view of a jet generating device according to another embodiment of the present invention. Description of parts, functions, etc. of the jet generating device of this embodiment that correspond to those of the jet generating device 10 of the previous embodiment will be simplified or omitted, that is, the description will be given focusing on the differences.

The inside of a housing 21 of a jet generating device 30 is partitioned by a vibrating plate 3 and a resilient supporting member 6, so that a first chamber 11a and a second chamber 11b are formed in the housing 21. The housing 21 has nozzles 2a and 2b defining openings connected to the first chamber 11a and the second chamber 11b, respectively. In such a jet generating device 30, applying, for example, a sinusoidal alternating voltage to an actuator 5 causes the vibrating plate 3 to vibrate. The vibration of the vibrating plate 3 alternately increases and decreases the pressure in the chambers 11a and 11b, so that air alternately flows into and out of the chambers 11a and 11b through the respective nozzles 2a and 2b. In other words, when air is discharged from the first chamber 11a to the outside of the housing 21 through the nozzle 2a, air flows into the second chamber 11b from the outside through the nozzle 2b. In contrast, when air is discharged from the second chamber 11b to the outside of the housing 21 through the nozzle 2b, air flows into the first chamber 11a from the outside through the nozzle 2a.

As with the jet generating device 10, the jet generating device 30 according to the embodiment is formed so that the frequency of a sound having a maximum noise level is a predetermined frequency. This makes it possible to reduce noise. In this case, it is desirable that the frequency of either a first sound or a second sound that is generated at least one of the first chamber 11a and the second chamber 11b fall within any of the aforementioned frequency ranges, such as equal to or greater than 1 Hz and less than 1 [kHz]. Alternatively, it is desirable that at least one of the first chamber 11a and the second chamber lib satisfy any one of the Formulas (2) to (7).

When air is discharged from the nozzles 2a and 2b, for example, sound is generated independently from each of the nozzles 2a and 2b. This sound is identified as the first sound. However, since sound waves that are generated at the nozzles 2a and 2b have opposite phases, the sound waves weaken each other. This makes it possible to further reduce noise.

It is desirable that the volumes of the first and second chambers 11a and 11b be the same. This causes the amount of air that is discharged to be the same, so that noise is further reduced.

Figure 5A:
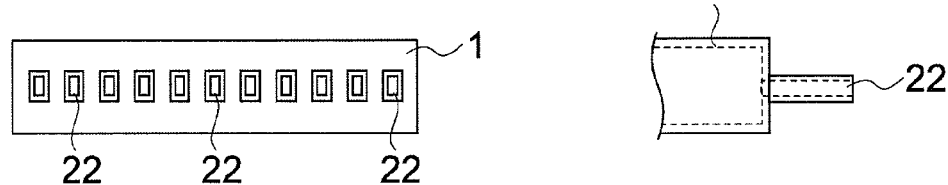
FIGS. 5A and 5B show housings of a jet generating device according to still another embodiment of the present invention.
Figure 5B:
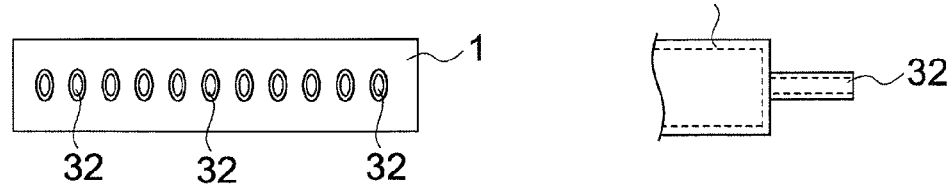

FIGS. 5A and 5B show housings of a jet generating device according to still another embodiment of the present invention. In each of FIGS. 5A and 5B, the left side is a front view and the right side is a side view of the housing, respectively. A plurality of nozzles 22 in a housing 1 shown in FIG. 5A have rectangular openings. A plurality of nozzles 32 in a housing 1 shown in FIG. 5B have elliptical openings. For the nozzles having such forms, when the opening area is considered, for example, a radius r of a circle having an area that is equal to the area of a rectangle if the nozzles are rectangular is considered.

FIGS. 6A to 6D show housings of a jet generating device according to still another embodiment of the present invention. A plurality of tubular openings 31a are formed in a housing 31 shown in FIG. 6A. These openings 31a function as nozzles. In other words, tubular holes may only be formed in the housing 31 instead of nozzles.

Figure 6A:
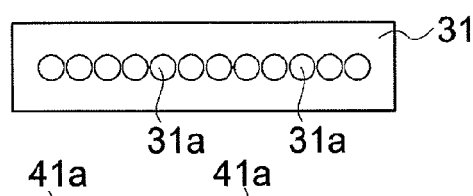
FIGS. 6A to 6D show housings of a jet generating device according to still another embodiment of the present invention.
Figure 6A:
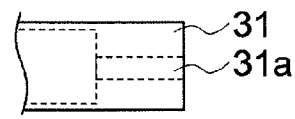
Figure 6B:
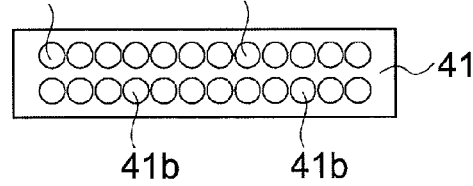
Figure 6B:
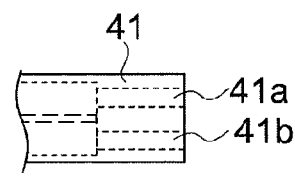

FIG. 6B shows a housing 41, such as that shown in FIG. 4, having two chambers. Openings 41a and 42b are connected to the respective chambers of the housing 41.

Figure 6C:
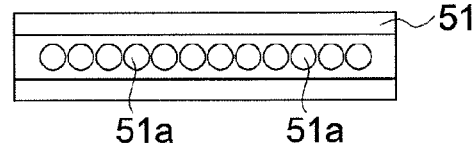
Figure 6C:
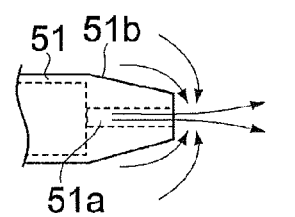

A housing 51 shown in FIG. 6C has an inclined surface 51b formed at a nozzle having openings 51a. In other words, the housing 51 has the inclined surface 51b which is such as to reduce a vertical width (in the figure) of the nozzle towards the outside of a chamber. Such a structure makes it easier for gas around the nozzle to be sucked in when air is discharged from the openings 51a. In other words, it is possible to increase a combined jet air amount. Instead of or in addition to the inclined surface 51b which is such as to reduce the vertical width, a different inclined surface which is such as to reduce a horizontal width (perpendicular to the plane of FIG. 6C) of the nozzle may be used.

Figure 6D:
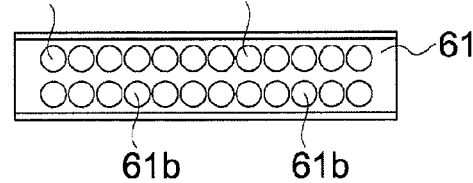
Figure 6D:
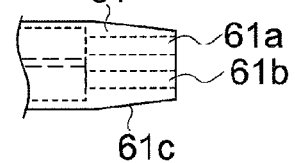

FIG. 6D shows a housing 61 having openings 61a and 61b connected to two chambers as in FIG. 6B and having inclined surfaces 61c as in FIG. 6C.

Figure 7:
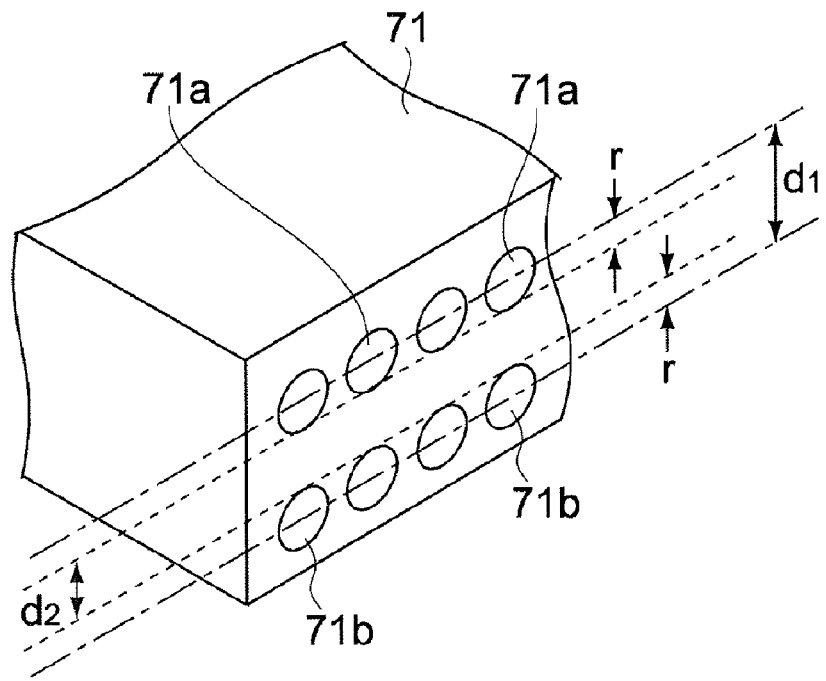
FIG. 7 is a sectional view of a portion of a housing of a jet generating device of still another embodiment of the present invention.

FIG. 7 is a sectional view of a portion of a housing of a jet generating device of still another embodiment of the present invention. A housing 71 has, for example, a plurality of openings 71a and openings 71b. For example, as shown in FIG. 6B, the housing 71 has two chambers therein and the plurality of openings 71a and the plurality of openings 71b are connected to the chambers.

Opening areas of the openings 71a and 71b are substantially the same and their equivalent circular diameters are r. In this case, as shown in FIG. 7, a distance $d_1$ between the openings 71a and the respective openings 71b (distance between the centers of the openings 71a and the respective openings 71b) is set equal to or greater than three times r, that is, a distance $d_2$ is set equal to or greater than 1 times r. For example, when air from the openings 71a is discharged to the outside, air flows into the housing 71 from the openings 71b. Therefore, when the openings 71a and 71b are too close to each other, the air discharged from the openings 71a flows into the housing 71 from the openings 71b. This may reduce the amount of air blown against a heating element (not shown). However, when $3r \leq d_1$ as in the embodiment, such a problem can be overcome.

When, for example, the wavelength of a second sound generated from each of the openings 71a and 71b is λ[m], it is desirable that $d_1 < \lambda/2$. In the case where the centers in the opening planes of the openings 71a and 71b are sound sources, respectively, when $d_1 < \lambda/2$, a location where substantially maximum vibration amplitudes of sound waves generated from the openings 71a and 71b strengthen each other no longer exists, so that it is possible to prevent noise from being generated. When the medium is air and the sound velocity is approximately 340 [m/s], the wavelength of sound in an audible range of human beings is on the order of from 1.7 [mm] to 17 [m].

Figure 8:
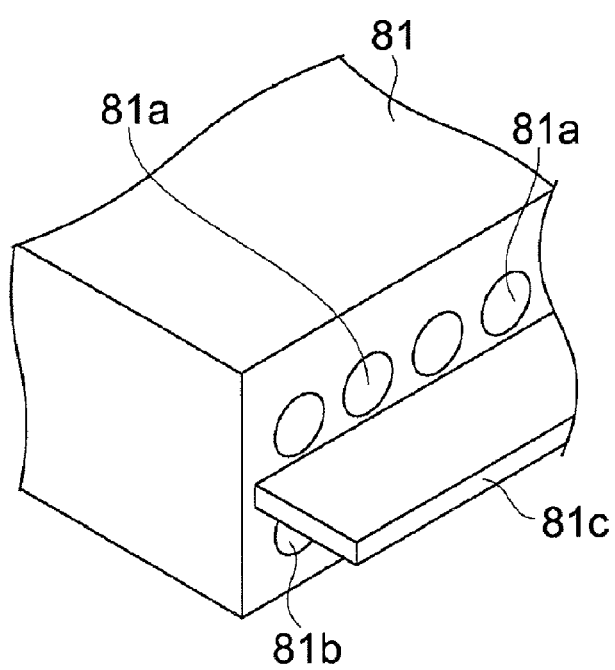
FIG. 8 is a perspective view of a modification of the housing shown in FIG. 7.

FIG. 8 is a perspective view of a modification of the housing 71 shown in FIG. 7. A partition plate 81c is mounted between openings 81a and 81b formed in a housing 81. The partition plate 81c may be formed of the same material as that of the housing 81 and integrated thereto. Similarly to the above, such a structure makes it possible to prevent the entering and leaving of air between the openings 81a and 81b. In this case, the distance between the openings 81a and the respective openings 81b does not necessarily have to be equal to or greater than 1 times r as it is in FIG. 7, that is, it may be less than 1 times r.

Figure 9A:
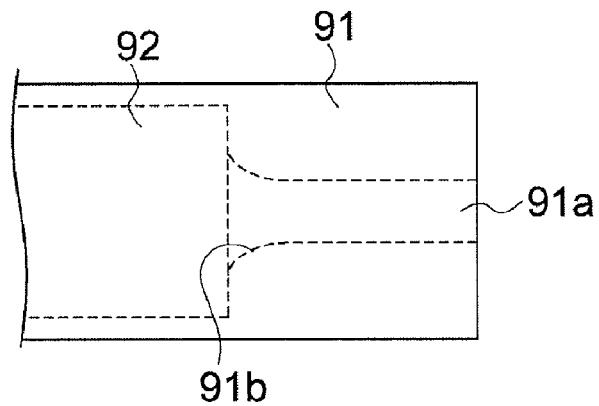
FIGS. 9A to 9C are side views showing portions of housings of a jet generating device according to still another embodiment of the present invention.
Figure 9B:
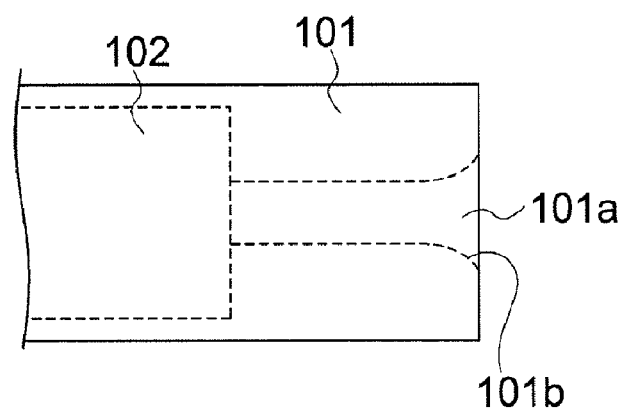
Figure 9C:
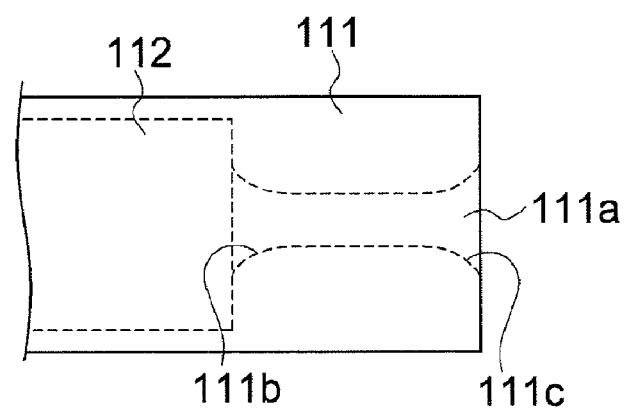

FIGS. 9A to 9C are side views showing portions of housings of a jet generating device according to still another embodiment of the present invention. As shown in FIG. 9A, an opening 91a for discharging air from a chamber 92 in a housing 91 is formed so that its opening area is increased at an end 91b adjacent the chamber 92 in the direction of the chamber 92. This smoothens airflow when the air flows in and out of the chamber 92, so that a noise level of a second sound is reduced.

At an opening 101a of a housing 101 shown in FIG. 9B, an end which is situated at a side opposite to a chamber 102, that is, an outer end 101b is formed so that its opening area is increased towards an outer side of the housing 101. Such a structure also smoothens airflow, thereby reducing the noise level of the second sound.

An opening 111a of a housing 111 shown in FIG. 9C is formed so that both ends 111b and 111c are widened. This further smoothens airflow.

The present invention is not limited to the above-described embodiments, so that various modifications may be made.

For example, although the housing 1 shown in FIG. 1 has a rectangular parallelepiped shape, it may have a cylindrical shape or a triangular prismatic shape. When the housing 1 has a cylindrical shape, that is, when its planar shape is, for example, circular, it is desirable that the vibrating plate 3 be disc-shaped. In other words, it is desirable that the housing 1 and the vibrating plate 3 have similar shapes.

The planar shape of the flat-plate yoke 18 shown in FIG. 1 is, for example, circular. However, it may be elliptical or rectangular. Although the vibrating plate 3 is rectangular in the relevant figures, the vibrating plate 3 may have a circular shape that is similar to the planar shape of the actuator 5.

Although, in FIGS. 9A to 9C, the ends 91b, 101b, 111b, and 111c are curved, they may have tapering shapes having flat inclined surfaces.

At least two of the above-described embodiments may be combined. For example, the ends defining the openings 41a and 41b of the respective chambers shown in FIG. 6B may having any one of the forms shown in FIGS. 9A to 9C. Alternatively, the openings 51a, etc., of the housing 51 shown in FIG. 6C or the openings 61a, etc., of the housing 61 shown in FIG. 6D may have any one of the forms shown in FIGS. 9A to 9C. Still alternatively, the distance between the nozzles 2a and 2b of the housing 21 shown in FIG. 4 may be $d_1$ as shown in FIG. 7.

What is claimed is:

1. A jet generating device comprising:
a vibrating member which vibrates gas;
a driving unit which drives the vibrating member; and
a housing (a) which has at least one first opening and a first chamber (a) containing the gas, (b) supports the vibrating member, and (c) is such that, of sounds generated as a result of vibrating the vibrating member, the sound having a maximum noise level has a predetermined frequency, the housing discharging the gas as pulsating gas through the at least one first opening as a result of driving the vibrating member, the first chamber being connected to the at least one first opening, wherein,
the housing is configured to produce the predetermined frequency utilizing a length of the at least one first opening, an opening area of the at least one first opening, and a volume of the first chamber, the length being in a direction in which the gas which is vibrated as a result of driving the vibrating member is discharged from the at least one first opening,
the predetermined frequency reduces the sounds audible to a user of a device associated with the jet generating device without reducing an amount of the discharged gas, and
when a sound velocity is C[m/s], a volume of the first chamber is V1 [m³], an equivalent circular radius of an opening area of the at least one first opening is r1 [m], the number of the at least one first opening is n1, and a length of the at least one first opening is L1 [m], any one of $\{C/(2\pi)\}[\pi r1^2/\{V1/(1.2 r1 \cdot n1^{1/2}+L)\}]^{1/2} < 1000$ as the predetermined frequency, $\{C/(2\pi)\}[\pi r1^2/\{V1/(1.2 r1 \cdot n1^{1/2}+L)\}]^{1/2} < 500$ as the predetermined frequency $\{C/(2\pi)\}[\pi r1^2/\{V1/(1.2 r1 \cdot n1^{1/2}+L1)\}]^{1/2} < 20$ as the predetermined frequency, $\{C/(2\pi)\}[\pi r1^2/\{V1/(1.2 r1 \cdot n1^{1/2}+L1)\}]^{1/2} \geq 6000$ as the predetermined frequency, $\{C/(2\pi)\}[\pi r1^2/\{V1/(1.2 r1 \cdot n1^{1/2}+L1)\}]^{1/2} \geq 10000$ as the predetermined frequency, and $\{C/(2\pi)\}[\pi r1^2/\{V1/(1.2 r1 \cdot n1^{1/2}+L1)\}]^{1/2} \geq 20000$ as the predetermined frequency is satisfied.

2. The jet generating device according to claim 1, wherein:
the predetermined frequency does not correspond to a resonant frequency of the housing and is effective to reduce the sounds audible to the user, and
the predetermined frequency is any one of equal to or greater than 1 [Hz] and less than 1 [kHz], equal to or greater than 1 [Hz] and less than 500 [Hz], equal to or greater than 1 [Hz] and less than 20 [Hz], equal to or greater than 6 [kHz] and less than 40 [kHz], equal to or greater than 10 [kHz] and less than 40 [kHz], and equal to or greater than 20 [kHz] and less than 40 [kHz].

3. The jet generating device according to claim 1, wherein:
the housing further has at least one second opening and a second chamber (a) connected to the at least one second opening, (b) disposed opposite to the first chamber, and (c) containing the gas, the gas being alternately discharged as the pulsating gas through the at least one first opening and the at least one second opening by driving the vibrating member, and
the sounds generated by alternatively discharging the pulsating gas through the at least one first opening and the at least one second opening destructively interfere with each other to reduce the sounds.

4. The jet generating device according to claim 3, wherein:
in order for the sound having the maximum noise level to have the predetermined frequency, at least one of a length of the at least one second opening, an opening area of the at least one second opening, and a volume of the second chamber is set, the length being in a direction in which the gas which is vibrated as a result of driving the vibrating member is discharged from the at least one second opening, and
sound waves from the at least one second opening are of an opposite phase of sound waves from the at least one first opening, wherein the sounds waves combine to reduce the sounds through destructive interference.

5. The jet generating device according to claim 3, wherein:
the predetermined frequency does not correspond to a resonant frequency of the housing to reduce the sounds audible to the user, and
the predetermined frequency is any one of equal to or greater than 1 [Hz] and less than 1 [kHz], equal to or greater than 1 [Hz] and less than 500 [Hz], equal to or greater than 1 [Hz] and less than 20 [Hz], equal to or greater than 6 [kHz] and less than 40 [kHz], equal to or greater than 10 [kHz] and less than 40 [kHz], and equal to or greater than 20 [kHz] and less than 40 [kHz].

6. The jet generating device according to claim 3, wherein, when a sound velocity is C[m/s], the volume of the second chamber is V2 [m³], an equivalent circular radius of the opening area of the at least one second opening is r2 [m], the number of the at least one second opening is n2, and the length of the at least one second opening is L2 [m], any one of $\{C/(2\pi)\}[\pi r2^2/\{V2/(1.2r29 \cdot n2^{1/2}+L2)\}]^{1/2}<1000$, $\{C/(2\pi)\}[\pi r2^2/\{V2/(1.2r2 \cdot n2^{1/2}+L2)\}]^{1/2}<500$, $\{C/(2\pi)\}[\pi r2^2/\{V2/(1.2r2 \cdot n2^{1/2}+L2)\}]^{1/2}<20$, $\{C/(2\pi)\}[\pi r2^2/\{V2/(1.2r2 \cdot n2^{1/2}+L2)\}]^{1/2} \geq 6000$, $\{C/(2\pi)\}[\pi r2^2/\{V2/(1.2r2 \cdot n2^{1/2}+L2)\}]^{1/2} \geq 10000$, and $\{C/(2\pi)\}[\pi r2^2/\{V2/(1.2r2 \cdot n2^{1/2}+L2)\}]^{1/2} \geq 20000$ is satisfied.

7. The jet generating device according to claim 3, wherein:
the housing further has a partition plate disposed at a surface of the housing between the at least one first opening and the at least one second opening, and
the partition prevents a same volume of the gas from simultaneously leaving and entering the at least first opening and the at least second opening to maximize the gas utilized to cool a heating element.

8. The jet generating device according to claim 3, wherein, when an equivalent circular radius of an opening area of the at least one first opening and an equivalent circular radius of an opening area of the at least one second opening, which are substantially the same, are r[m], a distance between the at least one first opening and the at least one second opening is d[m], and a wavelength of the sound having the maximum noise level is λ[m], $3r \leq d < \lambda/2$ is satisfied.

9. The jet generating device according to claim 3, wherein the at least one first opening has a first end which is disposed adjacent to the first chamber so that an opening area of the at least one first opening increases towards the first chamber.

10. The jet generating device according to claim 3, wherein the at least one second opening has a second end which is disposed adjacent to the second chamber so that an opening area of the at least one second opening increases towards the second chamber.

11. The jet generating device according to claim 3, wherein the at least one first opening has a first end which is disposed at an outer side of the housing so that an opening area of the at least one first opening increases at a sloped angle towards the outer side of the housing.

12. The jet generating device according to claim 11, wherein the at least one second opening has a second end which is disposed at the outer side of the housing so that an opening area of the at least one second opening increases at a sloped angle towards the outer side of the housing.

13. The jet generating device according to claim 3, wherein the at least one first opening has a first end and a second end, the first end being disposed adjacent to the first chamber so that an opening area of the at least one first opening increases towards the first chamber, the second end being disposed at an outer side of the housing so that the opening area of the at least one first opening increases towards the outer side of the housing.

14. The jet generating device according to claim 13, wherein the at least one second opening has a third end and a fourth end, the third end being disposed adjacent to the second chamber so that an opening area of the at least one second opening increases towards the second chamber, the fourth end being disposed at the outer side of the housing so that the opening area of the at least one second opening increases towards the outer side of the housing.

15. The jet generating device according to claim 3, wherein:
the housing further has a first nozzle for forming the at least one first opening therein, the first nozzle having a first inclined surface which is such as to reduce a width of the first nozzle towards an outer side of the housing, and
the housing further has a second nozzle for forming the at least one second opening therein, the second nozzle having a second inclined surface which is such as to reduce a width of the second nozzle towards the outer side of the housing.

16. The jet generating device according to claim 1, wherein the at least one first opening has an end which is disposed adjacent to the first chamber so that an opening area of the at least one first opening increases towards the first chamber.

17. The jet generating device according to claim 1, wherein the at least one first opening has an end which is disposed at an outer side of the housing so that an opening area of the at least one first opening increases towards the outer side of the housing.

18. The jet generating device according to claim 1, wherein the at least one first opening has a first end and a second end, the first end being disposed adjacent to the first chamber so that an opening area of the at least one first opening increases towards the first chamber, the second end being disposed at an outer side of the housing so that the opening area of the at least one first opening increases towards the outer side of the housing.

19. The jet generating device according to claim 1, wherein the housing further has a first nozzle for forming the at least one first opening therein, the first nozzle having a first inclined surface which is such as to reduce a width of the first nozzle towards an outer side of the housing.

20. An electronic apparatus comprising:
a heating element;
a vibrating member which vibrates gas;
a driving unit which drives the vibrating member; and
a housing which (a) has at least one first opening and a first chamber containing the gas, (b) supports the vibrating member, and (c) is such that, of sounds generated as a result of vibrating the vibrating member, the sound having a maximum noise level has a predetermined frequency, the housing discharging the gas as pulsating gas towards the heating element through the at least one first opening as a result of driving the vibrating member, the first chamber being connected to the at least one first opening,
wherein,
the housing is configured to produce the predetermined frequency utilizing a length of the at least one first opening, an opening area of the at least one first opening, and a volume of the first chamber, the length being in a direction in which the gas which is vibrated as a result of driving the vibrating member is discharged from the at least one first opening, the maximum noise level of the sound having the predetermined frequency is reduced without reducing an amount of the discharged gas, the predetermined frequency reduces the sounds audible to a user of a device associated with the jet generating device without reducing an amount of the discharged gas, the predetermined frequency does not correspond to a Helmholtz resonant frequency of the housing to reduce the sounds audible to the user, when a sound velocity is C[m/s] a volume of the first chamber is V1 [m$^3$], an equivalent circular radius of an opening area of the at least one first opening is r1[m] the number of the at least one first opening is n1 and a length of the at least one first opening is L1 [m], any one of $\{C/(2\pi)\}[\pi r1^2/\{V1/(1.2 r1 \cdot n1^{1/2}+L)\}]^{1/2}<1000$ as the predetermined frequency, $\{C/(2\pi)\}[\pi r1^2/\{V1/(1.2 r1 \cdot n1^{1/2}+L)\}]^{1/2}<500$ as the predetermined frequency, $\{C/(2\pi)\}[\pi r1^2/\{V1/(1.2 r1 \cdot n1^{1/2}+L1)\}]^{1/2}<20$ as the predetermined frequency, $\{C/(2\pi)\}[\pi r1^2/\{V1/(1.2 r1 \cdot n1^{1/2}+L1)\}]^{1/2} \geq 6000$ as the predetermined frequency, $\{C/(2\pi)\}[\pi r1^2/\{V1/(1.2 r1 \cdot n1^{1/2}+L1)\}]^{1/2} \geq 10000$ as the predetermined frequency, and $\{C/(2\pi)\}[\pi r1^2/\{V1/(1.2 r1 \cdot n1^{1/2}+L1)\}]^{1/2} \geq 20000$ as the predetermined frequency is satisfied, the predetermined frequency is effective to reduce the sounds audible to the user, and the predetermined frequency is any one of equal to or greater than 1 [Hz] and less than 1 [kHz], equal to or greater than 1 [Hz] and less than 500 [Hz], equal to or greater than 1 [Hz] and less than 20 [Hz] equal to or greater than 6 [kHz] and less than 40 [kHz], equal to or greater than 10 [kHz] and less than 40 [kHz] and equal to or greater than 20 [kHz] and less than 40 [kHz].

21. An electronic apparatus comprising:

a heating element;

a vibrating member which vibrates gas;

a driving unit which drives the vibrating member; and a housing which (a) has at least one first opening and a first chamber containing the gas, (b) supports the vibrating member, and (c) is such that, of sounds generated as a result of vibrating the vibrating member, the sound having a maximum noise level has a predetermined frequency, the first chamber being connected to the at least one first opening, the housing further includes at least one second opening and a second chamber connected to the at least one second opening, disposed opposite to the first chamber, and containing the gas, the gas being alternately discharged as a pulsating gas through the at least one first opening and the at least one second opening by driving the vibrating member, and wherein sound waves generated by alternatively discharging the pulsating gas through the at least one first opening and the sounds waves of the at least one second opening are of an opposite phase to destructively interfere with each other to reduce the sounds, wherein, the housing is configured to produce the predetermined frequency utilizing a length of the at least one first opening and the at least second opening, an opening area of the at least one first opening and the at least second opening, and a volume of the first chamber and the second chamber, the length being in a direction in which the gas which is vibrated as a result of driving the vibrating member is discharged from the at least one first opening and the at least one second opening to cool the heating element, and the maximum noise level of the sound having the predetermined frequency is reduced without reducing an amount of the discharged gas, wherein the predetermined frequency reduces the sounds audible to a user of a device associated with the jet generating device without reducing an amount of the discharged gas, and wherein the predetermined frequency does not correspond to a resonant frequency of the housing, when a sound velocity is C[m/s], a volume of the first chamber is V1 [m$^3$], an equivalent circular radius of an opening area of the at least one first opening is r1[m], the number of the at least one first opening is n1 and a length of the at least one first opening is L1 [m], any one of $\{C/(2\pi)\}[\pi r1^2/\{V1/(1.2 r1 \cdot n1^{1/2}+L)\}]^{1/2}<1000$ as the predetermined frequency, $\{C/(2\pi)\}[\pi r1^2/\{V1/(1.2 r1 \cdot n1^{1/2}+L)\}]^{1/2}<500$ as the predetermined frequency, $\{C/(2\pi)\}[\pi r1^2/\{V1/(1.2 r1 \cdot n1^{1/2}+L1)\}]^{1/2}<20$ as the predetermined frequency, $\{C/(2\pi)\}[\pi r1^2/\{V1/(1.2 r1 \cdot n1^{1/2}+L1)\}]^{1/2} \geq 6000$ as the predetermined frequency, $\{C/(2\pi)\}[\pi r1^2/\{V1/(1.2 r1 \cdot n1^{1/2}+L1)\}]^{1/2} \geq 10000$ as the predetermined frequency, and $\{C/(2\pi)\}[\pi r1^2/\{V1/(1.2 r1 \cdot n1^{1/2}+L1)\}]^{1/2} \geq 20000$ as the predetermined frequency is satisfied, the predetermined frequency is effective to reduce the sounds audible to the user, and the predetermined frequency is any one of equal to or greater than 1 [Hz] and less than 1 [kHz], equal to or greater than 1 [Hz] and less than 500 [Hz], equal to or greater than 1 [Hz] and less than 20 [Hz] equal to or greater than 6 [kHz] and less than 40 [kHz], equal to or greater than 10 [kHz] and less than 40 [kHz], and equal to or greater than 20 [kHz] and less than 40 [kHz].

\* \* \* \* \*